(12) United States Patent
Wang

(10) Patent No.: US 11,696,444 B2
(45) Date of Patent: Jul. 4, 2023

(54) SEMICONDUCTOR DEVICE AND METHOD OF FABRICATION THEREOF

(71) Applicant: YANGTZE MEMORY TECHNOLOGIES CO., LTD., Wuhan (CN)

(72) Inventor: Qiguang Wang, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 17/528,924

(22) Filed: Nov. 17, 2021

(65) Prior Publication Data

US 2022/0077188 A1 Mar. 10, 2022

Related U.S. Application Data

(63) Continuation of application No. 16/737,136, filed on Jan. 8, 2020, now Pat. No. 11,239,250, which is a continuation of application No. PCT/CN2019/110707, filed on Oct. 12, 2019.

(51) Int. Cl.
*H10B 41/35* (2023.01)
*H10B 43/27* (2023.01)
*H10B 41/27* (2023.01)
*H10B 43/35* (2023.01)

(52) U.S. Cl.
CPC .......... *H10B 43/27* (2023.02); *H10B 41/27* (2023.02); *H10B 41/35* (2023.02); *H10B 43/35* (2023.02)

(58) Field of Classification Search
None
See application file for complete search history.

(56) References Cited

U.S. PATENT DOCUMENTS

| | | | |
|---|---|---|---|
| 9,401,371 B1* | 7/2016 | Lee | ................... H01L 27/11565 |
| 10,115,730 B1 | 10/2018 | Baraskar et al. | |
| 10,446,578 B1 | 10/2019 | Howder et al. | |
| 10,453,856 B1* | 10/2019 | Lai | ..................... H01L 29/7926 |
| 2009/0180324 A1 | 7/2009 | Ramaswamy et al. | |
| 2010/0133606 A1 | 6/2010 | Jang et al. | |
| 2013/0273700 A1* | 10/2013 | Rabkin | .............. G11C 16/0483 438/510 |
| 2017/0330626 A1 | 11/2017 | Sakui | |

FOREIGN PATENT DOCUMENTS

| | | |
|---|---|---|
| CN | 102201416 A | 9/2011 |
| TW | I663732 B | 6/2019 |

* cited by examiner

*Primary Examiner* — Hsien Ming Lee
(74) *Attorney, Agent, or Firm* — Bayes PLLC

(57) ABSTRACT

Aspects of the disclosure provide a semiconductor device and a method to manufacture the semiconductor device. A semiconductor device includes one or more units of strings of cells, and dielectric structures extending in a vertical direction and a first direction perpendicular to the vertical direction and separating adjacent units of strings of cells. Each unit of strings of cells includes a first string of cells each including first cells, and a second string of cells each including second cells.

20 Claims, 13 Drawing Sheets

SEMICONDUCTOR DEVICE AND METHOD OF FABRICATION THEREOF

CROSS REFERENCE TO RELATED APPLICATIONS

This application is a continuation of U.S. application Ser. No. 16/737,136, filed on Jan. 8, 2020, entitled "SEMICONDUCTOR DEVICE AND METHOD OF FABRICATION THEREOF," which is a continuation of International Application No. PCT/CN2019/110707, filed on Oct. 12, 2019, both of which are incorporated herein by reference in their entireties.

BACKGROUND

As critical dimensions of devices in integrated circuits shrink to the limits of common memory cell technologies, techniques are developed to achieve greater storage capacity. Compared to a planar transistor structure, a vertical structure of the 3D NAND memory devices is involved with more complex manufacturing processes. As the 3D NAND memory devices migrates to configurations with more memory cell layers to achieve higher densities at a lower cost per bit, it becomes an increasing challenge to improve structures and methods for manufacturing the same.

SUMMARY

According to aspects of the disclosure, a semiconductor device includes a trench having first and second sidewalls that is formed in a stack over a substrate of the semiconductor device. The second sidewall is opposite to the first sidewall. The semiconductor device includes first strings of transistors disposed along the first sidewall of the trench where each first string of transistors is vertically stacked over the substrate along a vertical direction. The semiconductor device further includes first dielectric structures disposed within the trench between adjacent first strings of transistors.

In an embodiment, the first strings of transistors include first channel structures disposed along the first sidewall of the trench and first gate structures disposed along the first sidewall of the trench. In an example, the first gate structures are disposed on a same side of the first channel structures. In an example, the first gate structures partially surround the first channel structures. In an example, the first channel structures have a planar shape.

In an embodiment, the semiconductor device further includes second strings of transistors disposed along the second sidewall of the trench where each second string of transistors is vertically stacked over the substrate and adjacent second strings of transistors are separated by the first dielectric structures. In an example, each first string of the first strings of transistors and each second string of the second strings of transistors form a respective unit between two adjacent first dielectric structures. The first string and the second string in the unit can be separated by an insulating layer. In an example, the insulating layer is made of a different material than the first dielectric structure. In an example, the first string is surrounded, in a plane perpendicular to the vertical direction, by at least two different dielectric structures including the insulating layer and the first dielectric structure.

In an embodiment, the semiconductor device further includes another trench adjacent to the trench where the other trench has third and fourth sidewalls formed in the stack over the substrate. Third strings of transistors are disposed along the third sidewall of the other trench where each third string of transistors is vertically stacked over the substrate. In an example, the first strings of transistors and the third strings of transistors are separated by a second dielectric structure.

According to aspects of the disclosure, a method for manufacturing a semiconductor device includes forming a trench in a stack including alternating first layers and second layers where the stack is over a substrate of the semiconductor device and the trench has a first sidewall and a second sidewall that is opposite to the first sidewall. The method also includes forming channel materials in the trench where the channel materials are disposed along the first sidewall and the second sidewall, respectively. The method further includes dividing the trench into multiple units by replacing portions of the channel materials with first dielectric structures where remaining portions of the channel materials along the first and second sidewalls form first and second channel structures of first and second strings of transistors, respectively. Each of the first and second strings of transistors is vertically stacked over the substrate.

In an embodiment, the method further includes replacing the second layers with first and second gate structures of the first and second strings of transistors, respectively. The first gate structures are adjacent to the first sidewall and the second gate structures are adjacent to the second sidewall. In an example, the first gate structures are disposed on a same side of the first channel structures and the second gate structures are disposed on a same side of the second channel structures. In an example, the first gate structures partially surround the first channel structures and the second gate structures partially surround the second channel structures.

In an example, the first and second sidewalls of the trench have a planar shape and the first and second channel structures have a planar shape.

In an example, the method includes forming an insulating layer between the first channel structures and the second channel structures. In an example, each of the multiple units includes a first string of the first strings of transistors and a second string of the second strings of transistors where the first string and the second string are separated by the insulating layer.

In an example, the method also includes forming another trench in the stack that is adjacent to the trench and the other trench has a third sidewall and a fourth sidewall that is opposite to the third sidewall. The method includes forming third and fourth strings of transistors along the respective third and fourth sidewall of the other trench where each of the third and fourth strings of transistors is vertically stacked over the substrate. The method further includes forming a second dielectric structure that separates the third strings of transistors from the second strings of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
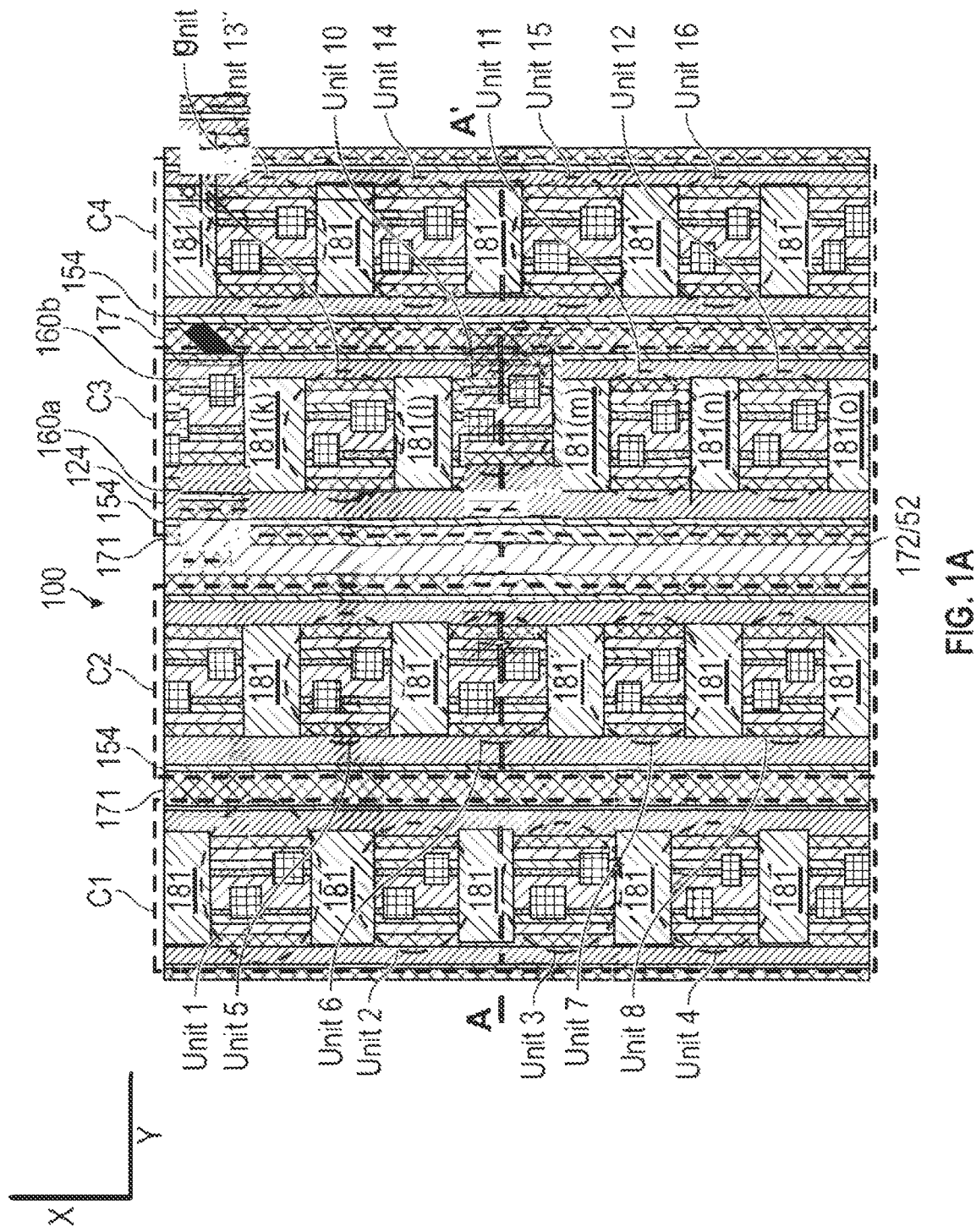
FIG. 1A shows a top view of a portion of a semiconductor device 100 in accordance with an exemplary embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A string of transistors can be formed in a semiconductor device by directly etching a channel hole in a stack including alternating first and second layers and then forming a channel structure along a sidewall of the channel hole where the channel hole and the channel structure extend along a Z direction perpendicular to a working surface of a substrate of the semiconductor device. A cross-sectional shape of the channel hole in a XY plane that is perpendicular to the Z direction can be circular, rectangular, or the like. A length and a width of the channel hole refer to dimensions of the channel hole along an X and a Y direction, respectively, where the X, Y, and Z directions are perpendicular to each other and the X and Y directions are in the XY plane. In an example, a ratio of the length over the width of the channel hole is close to 1, such as between 0.5 and 2. As a transistor density (i.e., a number of transistors per unit area) increases, the channel hole becomes deeper in the Z direction and/or smaller in the XY plane, and thus making manufacturing the string of transistors more challenging.

According to aspects of the disclosure, a trench with a much larger opening in the XY plane than that of the channel hole can be formed in the stack and then channel materials can be deposited along sidewalls of the trench. The trench can be elongated along the X direction and narrow along the Y direction where a ratio of a length over a width of the trench is much larger than 1, for example larger than 10, and a cross-sectional shape of the trench in the XY plane can be an elongated rectangle. The width of the trench can be similar to the width of the channel hole while the length of the trench can be much larger than the length of the channel hole, and thus the trench has a much larger opening in the XY plane than the channel hole. Accordingly, forming the elongated trench can be easier than forming the channel hole, and quality (e.g., depth control, uniformity across multiple trenches) of the trench can be better than a quality of the channel hole. For example, multiple trenches can be etched more uniformly to have similar depths than multiple channel holes. Similarly, depositing the channel materials in the elongated trench can be easier than forming the channel structure in the channel hole. Accordingly, quality, such as coverage and uniformity of the channel materials in the elongated trench can be better than that of the channel structure in the channel hole. Further, uniformity of the channel materials in the multiple trenches can be better achieved than the uniformity of channel structures in the multiple channel holes.

Subsequently, portions of the channel materials in the trench can be removed, for example, along the Y direction to form multiple channel structures, and thus the trench is divided into multiple units. Each of the multiple units can include at least one string of transistors. As described above, forming strings of transistors by forming the elongated trench followed by dividing the trench into the multiple units can be more advantageous than forming strings of transistors by etching the channel hole directly.

Figure 1B:
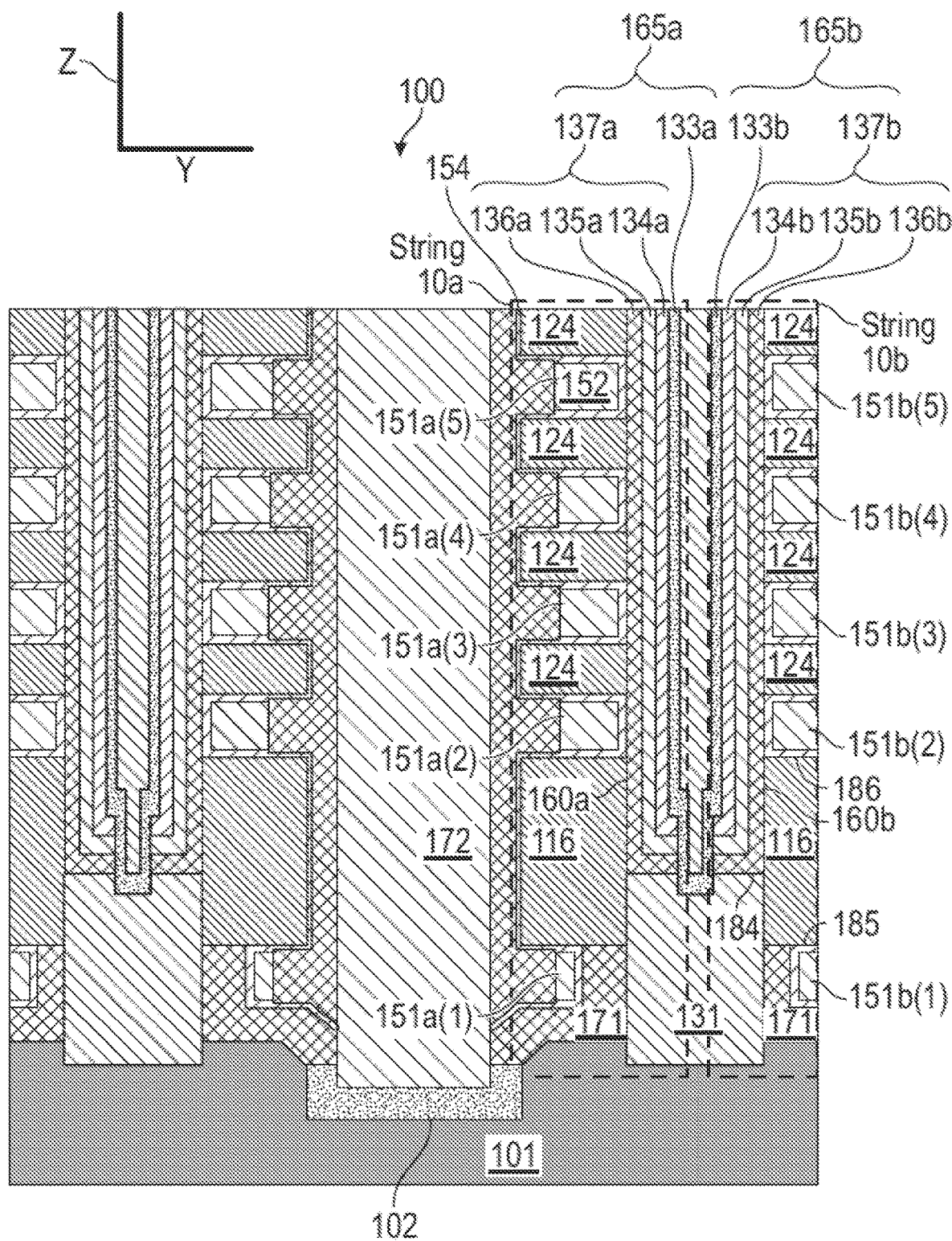
FIG. 1B shows a cross-sectional view of a portion of the semiconductor device 100 sectioned along AA' in FIG. 1A in accordance with an exemplary embodiment of the disclosure.

FIG. 1A shows a top view of a portion of a semiconductor device 100 in the XY plane in accordance with an exemplary embodiment of the disclosure. FIG. 1B shows a cross-sectional view in the YZ plane sectioned along AA' (also the Y direction) in FIG. 1A. For purposes of clarity, FIG. 1B shows the cross-sectional view of units 6 and 10. Referring to FIGS. 1A-1B, the semiconductor device 100 includes a plurality of units 1-16 formed over a substrate 101 where each of the units 1-16 can include one or more strings of transistors. In the example shown in FIGS. 1A-1B, the units 1-16 are arranged in columns 1-4 (C1-C4) corresponding to four trenches formed in the semiconductor device 100. C1 includes the units 1-4, C2 includes the units 5-8, C3 includes the units 9-12, and C4 includes the units 13-16. In an embodiment, the units in a same column are formed in a same trench having a first and a second sidewall. For example, the units 9-12 are formed in a same trench having a first sidewall 160a and a second sidewall 160b, and the first sidewall 160a and the second sidewall 160b are opposite to each other. The units 1-16 can be separated along the Y direction by dielectric structures 171 and separated along the X direction by dielectric structures 181. For example, the unit 10 in C3 is separated (or electrically isolated) from adjacent units (i.e., the units 9 and 11) in the same column C3 by the dielectric structures 181(l)-181(m). The unit 10 is also separated from the units 6, 14, and 15 in adjacent columns (i.e., C2 and C4) by the dielectric structures 171. The dielectric structures 171 and the dielectric structures 181 can have different materials and/or be formed at different steps in a process to manufacture the semiconductor device 100.

In general, the semiconductor device 100 can include any suitable number of columns, each of the columns can include any suitable number of units, each unit can include one or more strings of transistors, and each string can include a suitable number of transistors, for example, based on device characteristics and design considerations. Similarly, a first distance between adjacent columns, the width of the trenches, a second distance between adjacent units in a same column, and an arrangement of units in the columns, can be determined, for example, based on device characteristics and design considerations. In an example, the first distance between adjacent columns is between 50 to 500 nm and the second distance between adjacent columns is between 10 to 300 nm. When a size of the dielectric structures 181 decreases, the second distance can be further reduced.

Figure 1C:
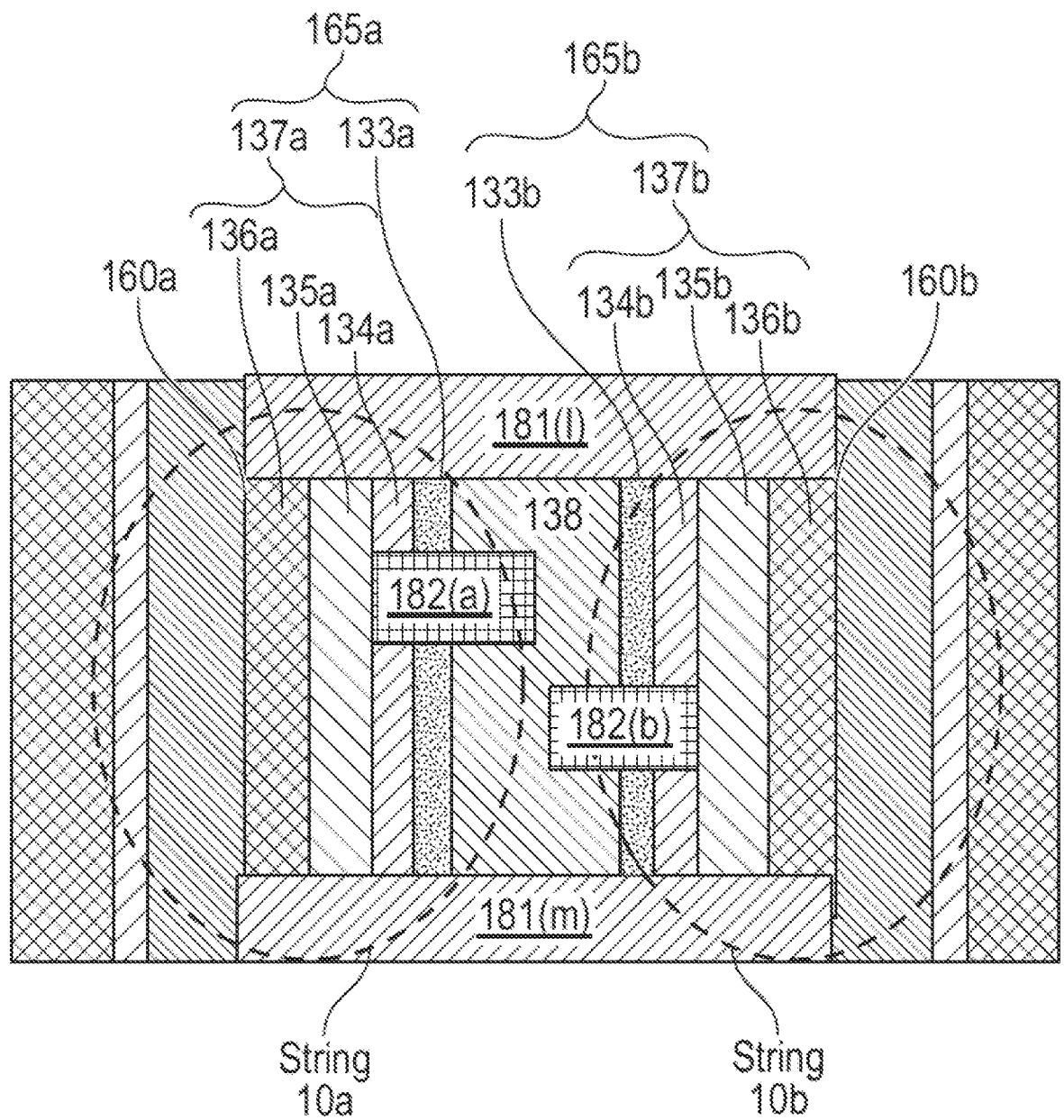
FIG. 1C shows a top view of a unit of the semiconductor device 100 in accordance with an exemplary embodiment of the disclosure.

In an embodiment, each of the units 1-16 includes a first string of transistors disposed along the first sidewall and a second string of transistors disposed along the second sidewall. Referring to FIG. 1A, the units 9-12 include the first strings of transistors disposed along the first sidewall 160a and the second strings of transistors disposed along the second sidewall 160b. FIG. 1C shows a top view of a unit (i.e., the unit 10) in accordance with an exemplary embodiment of the disclosure. The unit 10 includes a first string, i.e., strings 10a, disposed along the first sidewall 160a and a second string, i.e., strings 10b, disposed along the second sidewall 160b. Each of the strings 10a-b includes transistors stacked along the Z direction above the substrate 101. The strings 10a-10b are separated by an insulating layer 138. The insulating layer 138 can have different materials, such as different material composition or different material density, and/or be formed at a different step in the process to manufacture the semiconductor device 100 than the step(s) to manufacture the dielectric structures 171 and/or the dielectric structures 181.

Referring to FIGS. 1B-1C, the string 10a has a channel structure 165a formed along the first sidewall 160a. The channel structure 165a extends along the Z direction. The string 10a includes 5 transistors 121a(1)-(5) having respective gate structures 151a(1)-(5) separated by insulating layers 124 that can electrically isolate the gate structures 151a(1)-(5) from each other.

Similarly, the string 10b has a channel structure 165b formed along the second sidewall 160b. The second sidewall 160b can be opposite to the first sidewall 160a. The channel structure 165b extends along the Z direction. The string 10b includes 5 transistors 121b(1)-(5) having respective gate structures 151b(1)-(5) separated by the insulating layers 124 that can electrically isolate the gate structures 151b(1)-(5) from each other. Further, the other units 1-9 and 11-16 can include the first and second strings of transistors that have similar or identical structures and materials as those of the strings 10a-b in the unit 10.

In an example, the first and second sidewalls 160a-b have a planar shape and are opposite to each other, and the channel structures 165a-b have a planar shape and are opposite to each other. Referring to FIGS. 1A-1C, the gate structures 151a(1)-151a(5) are disposed on a same side (e.g., a left side) of the channel structure 165a and only partially surround the channel structure 165a in the XY plane. The gate structures 151b(1)-151b(5) are disposed on a same side (e.g., a right side) of the channel structure 165b and only partially surround the channel structure 165b in the XY plane. The gate structures 151a(1)-(5) are disposed along the first sidewall 160a and the gate structures 151b(1)-(5) are disposed along the second sidewall 160b.

As described above, the strings 10a-b can be made by forming an elongated trench along the X direction followed by depositing channel materials in the trench. Subsequently, portions of the channel materials are removed and the dielectric structures 181(k)-181(o) are formed to divide the trench into the units 9-12. Accordingly, the strings 10a-b can be formed along the first and second sidewalls 160a-b of the unit 10, respectively.

As described above, strings of transistors can be formed directly in channel holes where a width and a length of the channel holes are comparable. For example, the channel holes are formed followed by depositing channel structures in the channel holes to form the strings of transistors, respectively. Each channel hole can include a string of transistors. A channel structure of the string can have a cylindrical shape, a tapered cylindrical shape, or the like. Further, a gate structure can completely surround the channel structure and also have a cylindrical shape, a tapered cylindrical shape, or the like. Each of the strings formed directly in the channel hole is surrounded by or adjacent to the same dielectric structure along different directions in the XY plane, and thus can be separated from adjacent strings by the same dielectric structure along different directions in the XY plane.

On the other hand, a string, such as the string 10a, in the semiconductor devices 100 is separated from adjacent strings by different dielectric structures along different directions in the XY plane. For example, along the X direction, the string 10a (i.e., one of the first strings) in the unit 10 is separated from adjacent first strings in neighboring units (e.g., the units 9 and 11) by the dielectric structures 181(l)-181(m). Along the Y direction, the string 10a is separated from the adjacent string 10b in the same unit 10 by the insulating layer 138. Further, the string 10a is also separated from other adjacent strings (e.g., strings in the units 6, 14, 15, and the like) in neighboring columns by the dielectric structures 171. Accordingly, the string 10a in the semiconductor device 100 is surrounded by or adjacent to different dielectric structures along different directions in the XY plane. For example, the string 10a is surrounded by the insulating layer 138, the dielectric structures 181(l)-181(m), and the dielectric structures 171.

A geometric relationship between a channel structure and corresponding gate structures in a string of transistors of the semiconductor devices 100 can be different from that of the strings formed directly in the channel holes. For example, the gate structures 151a(1)-(5) of the transistors 121a(1)-(5) in the string 10a are disposed on the same side of the channel structure 165a and do not completely surround or only partially surround the channel structure 165a. On the contrary, the gate structures of one of the strings formed directly in the channel holes can completely surround the channel structure of the one of the strings formed directly in the channel holes. Further, geometric shapes of the channel structures in the semiconductor device 100 and the strings formed directly in the channel holes can be different. For example, the channel structure 165a in the string 10a has a planar shape while the channel structure in the one of the strings formed directly in the channel holes has a cylindrical or tapered cylindrical shape.

The semiconductor device 100 can be a nonvolatile memory device, such as a three-dimensional (3D) NAND flash memory device where the transistors 121a(2)-(4) and 121b(2)-(4) can be memory cells and can be stacked along the Z direction to increase a storage density.

Referring to FIG. 1B, a first contact 131 can extend into the substrate 101. In some examples, a top surface 184 of the first contact 131 is above a top surface 185 of the gate structure 151a(1) or 151b(1) and below a bottom surface 186 of the gate structure 151a(2) or 151b(2). The top surface 184 can be located at a mid-position between the top surface 185 and the bottom surface 186. The first contact 131 can include Si, such as monocrystalline Si.

Multiple channel structures can be separately disposed from each other over the substrate 101 to form the first and second strings in the units 1-16, respectively. For purposes of clarity, the channel structure 165a is described below, and the description can be suitably adapted to other channel structures including the channel structure 165b. The channel structure 165a can have any suitable shape, dimension, and materials. The channel structure 165a can include a gate dielectric structure 137a and a channel layer 133a sequentially formed along the first sidewall 160a. The gate dielectric structure 137a is disposed between the channel layer 133a and the gate structures 151a(1)-(5). The gate dielectric structure 137a can extend in the Z direction. The gate dielectric structure 137a can have any suitable shape, dimension, and materials. In an example, the gate dielectric structure 137a has a planar shape. The gate dielectric structure 137a can include multiple dielectric layers, such as a tunnel insulating layer 134a, a charge storage layer 135a, and a blocking insulating layer 136a that are sequentially stacked over the channel layer 133a. The transistors 121a(2)-(4) can be floating-gate transistors where electric charges from the channel layer 133a are transferred into the charge storage layer 135a via a quantum tunneling process through the tunneling insulating layer 134a. The charge storage layer 135a (also referred to as a floating gate) can store data, e.g., the electric charges. In an example, thicknesses of the tunnel insulating layer 134a, the charge storage layer 135a, and the blocking insulating layer 136a range from 1 to 5 nm, 3 to 10 nm, 1 to 10 nm, respectively. A thickness of the gate dielectric structure 137a can range from 5 to 25 nm. In an example, the thickness of the gate dielectric structure 137a is from 18 to 25 nm. The thickness of the gate dielectric structure 137a can be further reduced or increased according to manufacturing processes and/or design considerations.

The channel layer 133a can have any suitable shape(s), dimension, and materials. In an example, the channel layer 133a has a planar shape. The channel layer 133a can include one or more semiconductor materials that can be intrinsic, p-type doped, n-type doped, and the like. In an example, the channel layer 133a includes polysilicon and has a thickness from 3 to 5 nm. Referring to FIG. 1B, the insulating layer 138 fills a space between the channel layers 133a-b and separates the channel layers 133a-b, and thus separating the strings 10a-b. In an example, the insulating layer 138 does not completely fill the space between the channel layers 133a-b, and thus a gap filled with ambient gas can be within the insulating layer 138.

Each of the gate structures 151a(1)-(5) and 151b(1)-(5) can include dielectric material(s) and conductive material(s), such as a high dielectric constant (high-K) material 154 (also referred to as a high-K layer 154) and a metal layer 152 shown in FIG. 1B. The high-K layer 154 can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The metal layer 152 can include a metal having high conductivity, such as tungsten (W), copper (Cu), and the like. The gate structures 151a(1)-(5) and 151b(1)-(5) can also include a glue layer 153 that is disposed between the high-K layer 154 and the metal layer 152. The glue layer 153 can include refractory metals, such as titanium (Ti), tantalum (Ta) and their nitrides, such as TiN, TaN, W2N, TiSiN, TaSiN, and the like. The gate structures 151a(1)-(5) and 151b(1)-(5) can have any suitable thicknesses according to desired characteristics of the semiconductor device 100. The thicknesses can range from 20 to 50 nm, such as 35 nm. Further, the thicknesses can be equal to one another or be different from one another.

A portion of an insulating layer 171 can be formed between the gate structure 151a(1) and the substrate 101 and an insulating layer 116 can be formed between the gate structures 151a(1) and 151a(2). The insulating layers 116, 124, and 171 can include any suitable insulating material(s), such as silicon oxide, silicon carbon oxide (SiCO), silicon germanium oxide (SiGeO2). The insulating layers 124 can have any suitable thicknesses, such as between 20 and 40 nm, according to desired characteristics of the semiconductor device 100. In an example, the insulating layers 124 have substantially identical thicknesses, such as 25 nm. The insulating layer 116 can include SiO2 having a thickness of 130-180 nm. The portion of the insulating layer 171 between the gate structure 151a(1) and the substrate 101 can have a thickness about 18 nm.

The channel structure 165a and the gate structures 151a(2)-(4) form the respective transistors 121a(2)-(4). Operations of the transistors 151a(2)-(4), for example, where data are written into, erased from, and read from the transistors 121a(2)-(4), can be controlled by applying suitable voltages to the respective gate structures 151a(2)-(4).

Referring to FIG. 1B, the channel layer 133a can be electrically connected to the first contact 131, and the first contact 131 can be electrically coupled to the substrate 101. Referring to FIGS. 1A and 1C, the channel layer 133a can be electrically connected to a bit line (not shown) via a second contact 182a made of, for example, polysilicon.

FIG. 1B shows the 4 memory cells 121a(2)-(4) and 121b(2)-(4) in the strings 10a-b, respectively. Of course, any suitable number of memory cells can be formed in the string 10a, depending on a capacity of the semiconductor device 100. A number of memory cells in the string 10a can be 32, 64, 96, 128, or the like.

In some examples, the transistors 121a(2)-(4) are used as memory cells 121a(2)-(4) to store data. The strings 10a can also include a first selection structure, e.g., 121a(1) and a second selection transistor, e.g., 121a(5) that are connected in series with the memory cells 121a(2)-(4). In general, to access individual transistors that store data in a memory device, additional circuits can be formed as described below. A bit line (not shown) can be connected to one side of the string 10a, for example, via a second contact 182a adjacent to the second selection transistor 121a(5). A source line (not shown) can be connected to another side of the string 10a, for example, via the first contact 131 adjacent to the first selection structure 121a(1). The second selection transistor 121a(5) can be disposed between the bit line and the uppermost memory cell 121a(4). The first selection structure 121a(1) can be disposed between the lowermost memory cell 121a(2) and the source line. In some examples, multiple memory cells in a same layer can be controlled by a word line (not shown) connected to respective gate structures.

In some examples, the first selection structure 121a(1) has similar or identical structure, dimension, and materials to those of the memory cells 121a(2)-(4), however, the first selection structure 121a(1) can be operated as a first selection transistor instead of a memory cell. In some examples, the first selection structure 121a(1) has different structure and materials from those of the memory cells 121a(2)-(4). Referring to FIG. 1B, the first selection structure 121a(1) includes the gate structure 151a(1), the dielectric structure 171, and the first contact 131 where the dielectric structure 171 is sandwiched between the gate structure 151a(1) and the first contact 131.

The second selection transistor 121a(5) can have similar or identical structure, dimension, and materials to those of the memory cells 121a(2)-(4), however, the second selection transistor 121a(5) can be operated as the second selection transistor instead of a memory cell.

In addition to the second selection transistor 121a(5), one or more additional transistors can be disposed above the transistor 121a(5) and used as the second selection transistors in the string 10a. Similarly, in addition to the first selection structure 121a(1), one or more additional selection structures can be disposed below the transistor 121a(2) and used as the first selection structures in the string 10a. The first selection structures and the second selection transistors can have a structure similar or identical to that of the memory cells. Alternatively, the first selection structures and the second selection transistors can have structures different from that of the memory cells.

Referring to FIGS. 1A-1B, one or more common source regions (CSRs), such as a CSR 52, can be formed over the substrate 101 and extend in the X and Z directions, respectively. The CSR 52 can include a conductive layer 172 and a doped region 102. The CSR 52 is electrically coupled with the substrate 101 via the doped region 102. Portions of the dielectric structure 171 are formed between the CSR 52 and the gate structures 151a (1)-(5). The dielectric structure 171 can be made of SiO2, the conductive layer 172 can be made of polysilicon, and the doped region 102 can be N-type doped through one or more ion implantation processes.

Figure 2A:
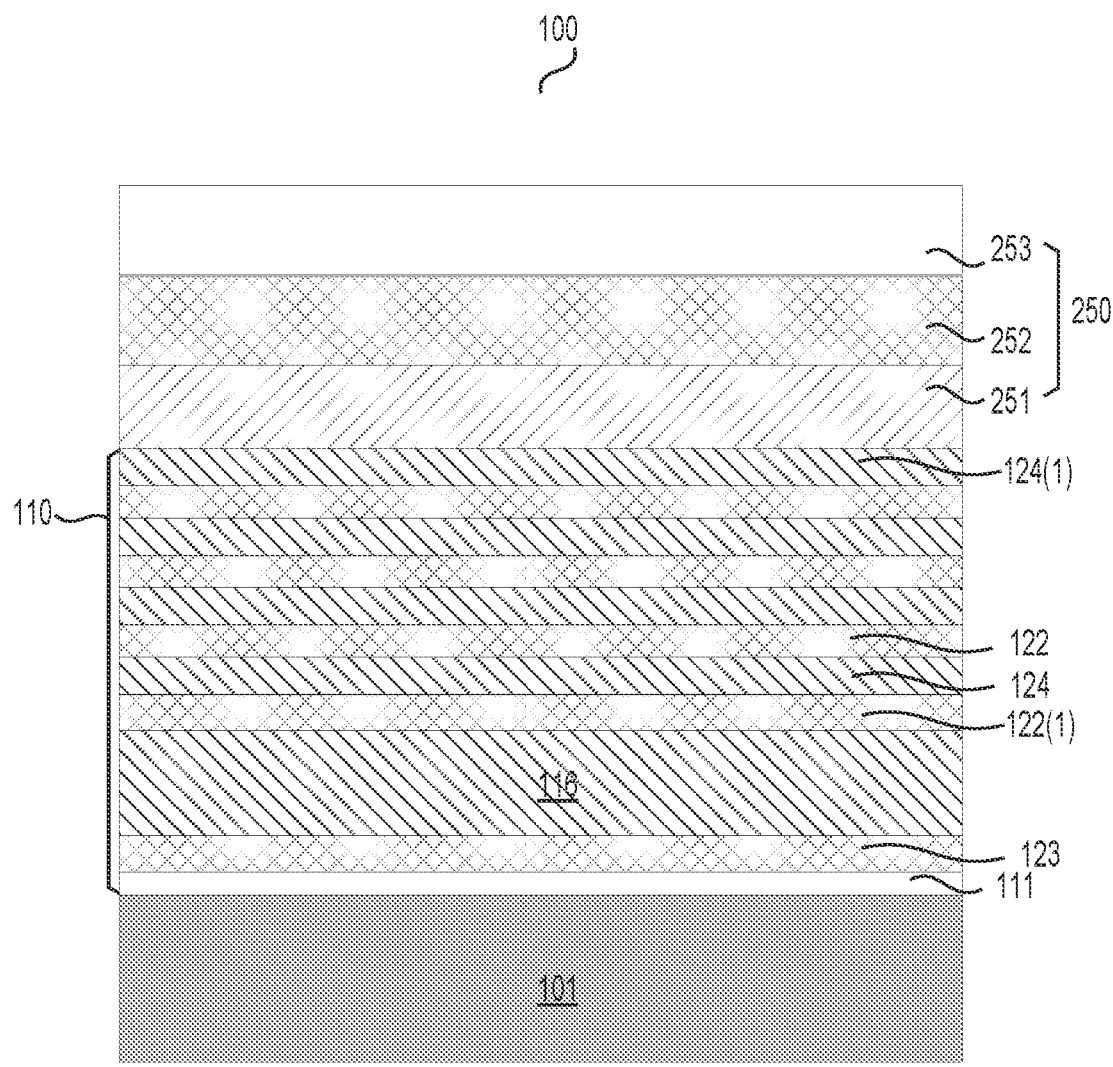
FIG. 2A is a cross-sectional view of a portion of the semiconductor device 100 at a step of an exemplary process according to an embodiment of the disclosure.
Figure 2B:
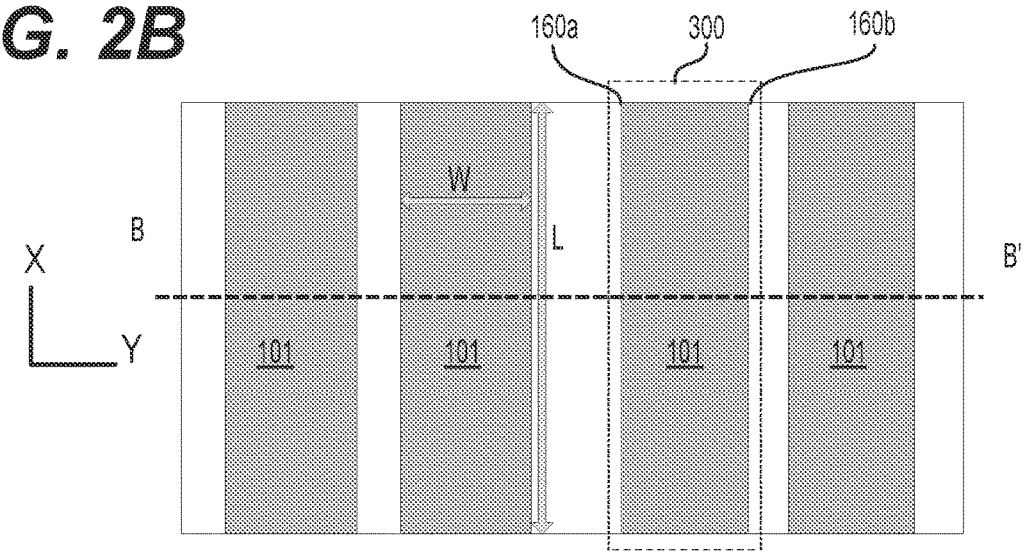
FIGS. 2B and 2C are a top view and a cross-sectional view of a portion of the semiconductor device 100 sectioned along BB' in FIG. 2B at another step of the exemplary process according to an embodiment of the disclosure.
Figure 2C:
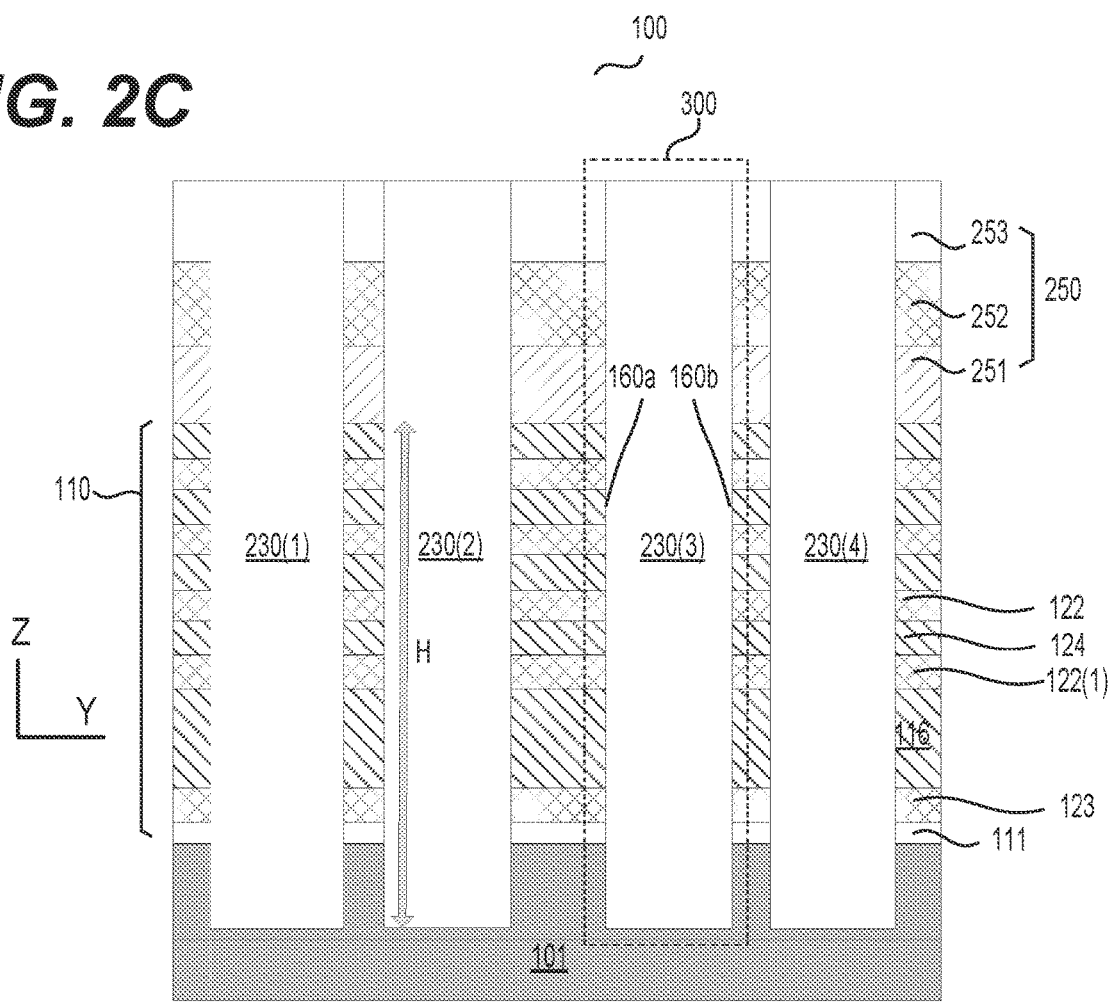
Figure 8A:
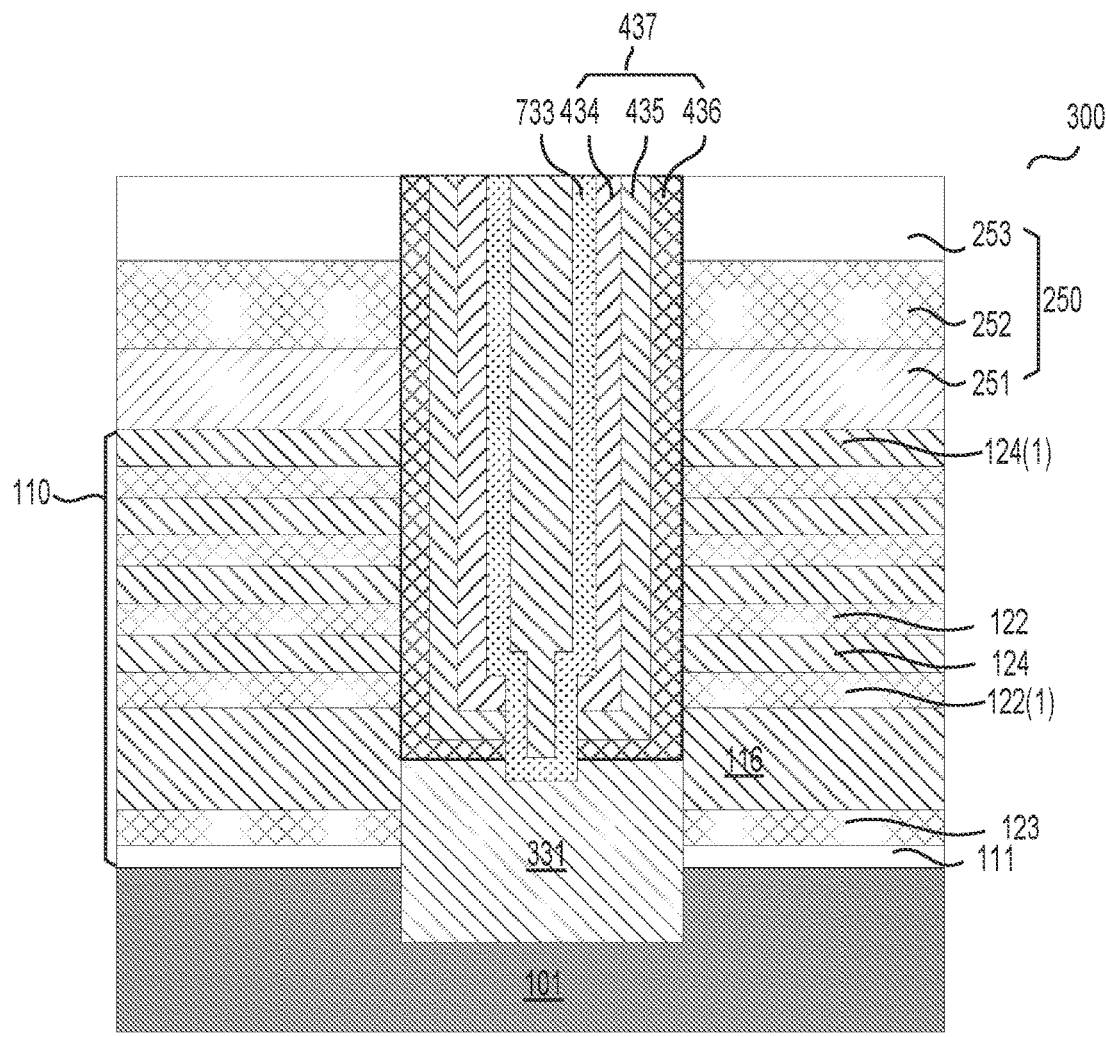
Figure 8B:
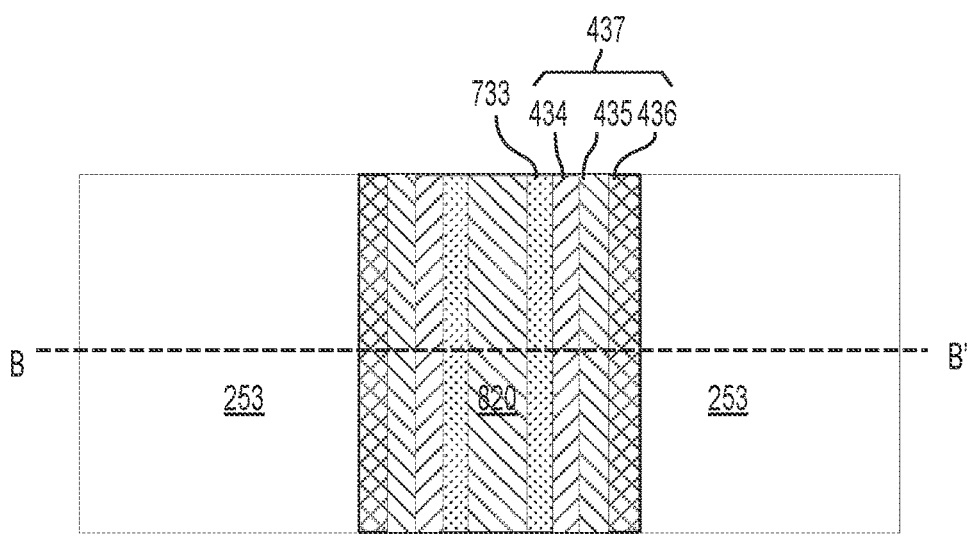
Figure 9A:
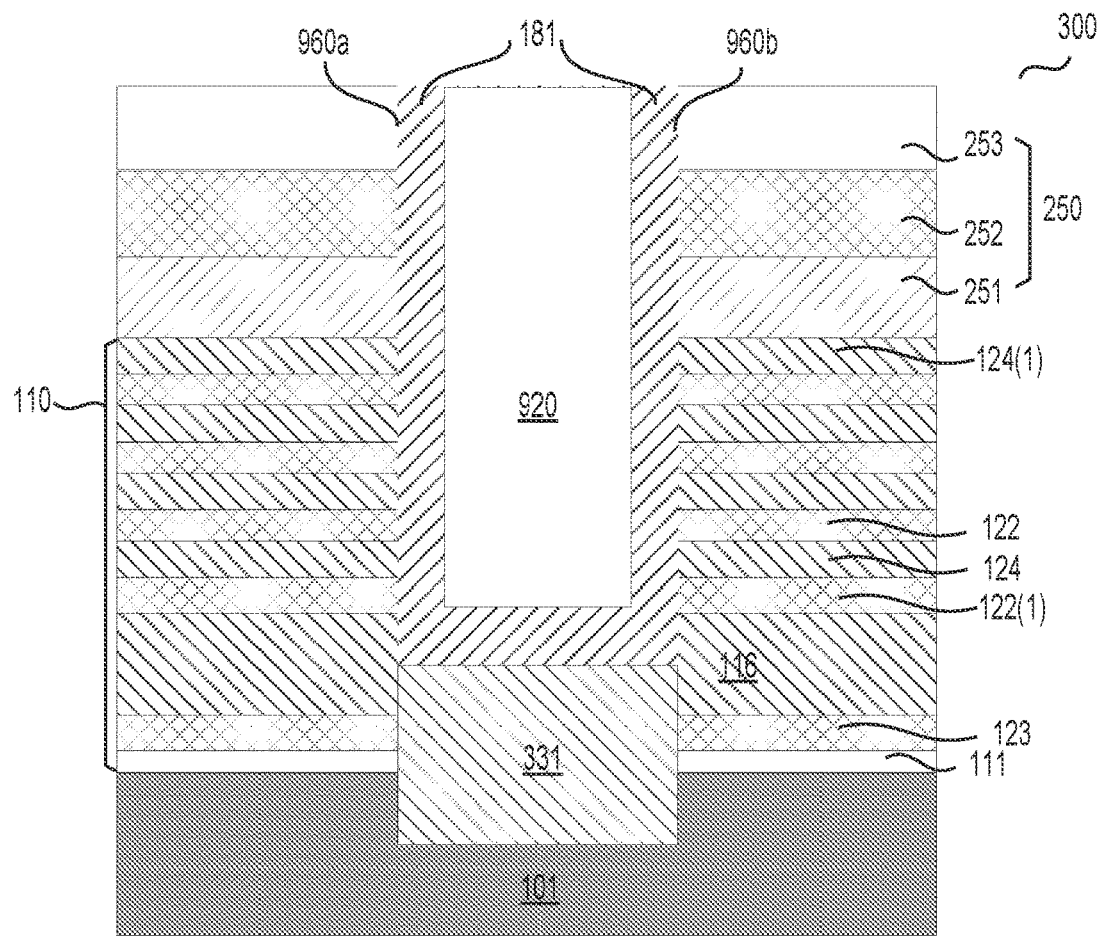
FIG. 9A shows a cross-sectional view of a portion of the semiconductor device 100 in accordance with exemplary embodiments of the disclosure.
Figure 9B:
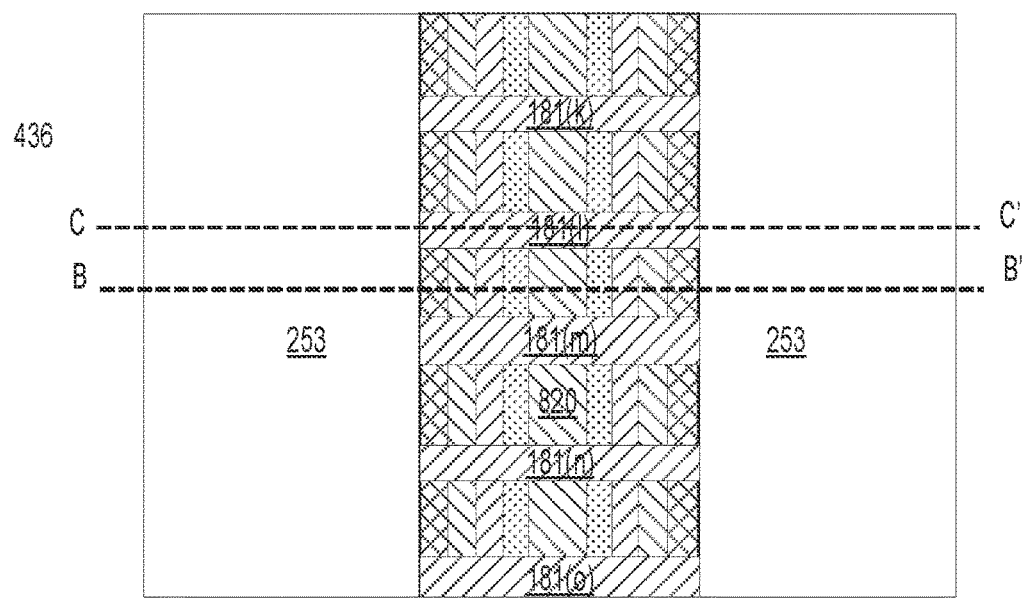
FIG. 9B shows a top view of the portion of the semiconductor device 100 corresponding to FIG. 9A in accordance with exemplary embodiments of the disclosure.
Figure 10:
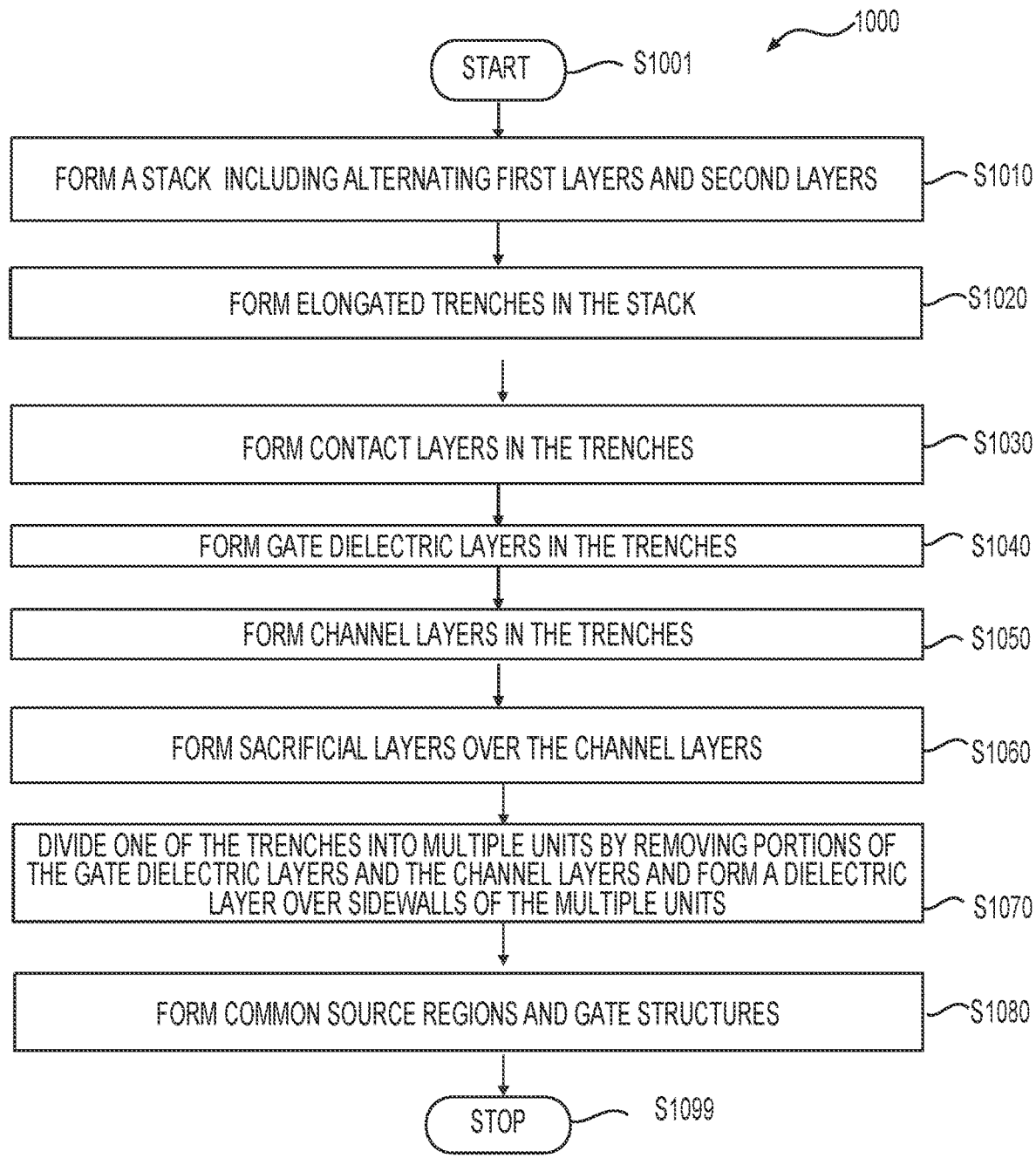
FIG. 10 shows a flow chart outlining an exemplary process for semiconductor fabrication according to an embodiment of the disclosure.

FIG. 2A is a cross-sectional view of a portion of the semiconductor device 100 at a step of an exemplary process according to an embodiment of the disclosure. FIGS. 2B and 2C are a top view and a cross-sectional view of the portion of the semiconductor device 100 sectioned along BB' in FIG. 2B at another step of the exemplary process according to an embodiment of the disclosure. FIGS. 3B, 4B, 5B, 6B, 7B, and 8B are top views of a portion of the semiconductor device 100 at various steps of the exemplary process according to embodiments of the disclosure. FIGS. 3A, 4A, 5A, 6A, 7A, and 8A are cross-sectional views of the portion of the semiconductor device 100 sectioned along BB' in respective FIGS. 3B, 4B, 5B, 6B, 7B, and 8B according to exemplary embodiments of the disclosure. FIG. 9B is a top view of the portion of the semiconductor device and FIG. 9A is a cross-sectional view along CC' in FIG. 9B. FIG. 10 shows a flow chart outlining an exemplary process 1000 for semiconductor fabrication according to an embodiment of the disclosure. The process 1000 can be used to fabricate the semiconductor device 100 shown in FIG. 1A-1C. As used herein, a semiconductor device can include transistors (e.g., field-effect transistors and floating-gate transistors), integrated circuits, a semiconductor chip (e.g., memory chip including a 3D NAND memory device, a logic chip on a semiconductor die), a stack of semiconductor chips, a semiconductor package, a semiconductor wafer, and the like.

The process 1000 starts at step S1001 and proceeds to step S1010. Referring to FIGS. 2A and 10, at step S1010, a stack 110 can be formed over the substrate 101. The stack 110 includes alternating first layers 122 and second layers (also referred to as the insulating layers 124). Multiple strings of transistors, such as the strings 10a-10b, can be formed in the stack 110. The substrate 101 can be any suitable substrate and can be processed with various suitable features. The substrate 101 can be formed of any suitable semiconductor material, such as silicon (Si), germanium (Ge), SiGe, a compound semiconductor, an alloy semiconductor, and the like. Additionally, the substrate 101 can include various layers, including conductive or insulating layers formed on a semiconductor substrate. The substrate 101 can be a silicon-on-insulator (SOI) substrate. Further, the substrate 101 can include an epitaxial layer formed on insulator. The substrate 101 can include various doping configurations depending on design requirements.

The stack 110 can be manufactured using a variety of semiconductor processing techniques, such as photolithography, chemical vapor deposition (CVD) including furnace CVD, low pressure CVD, and the like, physical vapor deposition (PVD), atomic layer deposition (ALD), dry etching, wet etching, chemical mechanical planarization (CMP), ion implantation, and the like.

The stack 110 can further include one or more additional layers, such as the insulating layers 111 and 116 and a layer 123, between the substrate 101 and the lowermost first layer 122(1). In some examples, the insulating layer 111 includes SiO2 having a thickness about 18 nm, the layer 123 includes silicon nitride having a thickness of 10 to 100 nm, the insulating layer 116 includes SiO2 having a thickness of 130-180 nm.

The first layers 122 and the second layers 124 are alternately formed over the insulating layer 116 and can include, for example, any suitable dielectric materials that have different etch rates. For example, the first layers 122 can be formed with silicon nitride, the second layers 124 can be formed by using a dielectric material, such as $SiO_2$, that has a different etch rate from that of the first layers 122. In various examples, the layer 123 and the first layers 122 are removed and replaced with the respective gate structures, such as 151a(1)-(5) and 151b(1)-(5) in subsequent steps.

Thicknesses of the first layers 122 can be different from or identical to each other. In an example, the thicknesses of the first layers 122 range from 20 to 50 nm, for example, the thickness of the first layers 122 can be about 35 nm. Any suitable deposition process, such as CVD, PVD, ALD, or any combination thereof, can be applied to form the first layers 122.

The second layers 124 can have any suitable thicknesses, such as between 20 and 40 nm, and can be formed by performing CVD, PVD, ALD, or any combination thereof. In an example, the thickness of the second layers 124 is 25 nm.

In an example, a thickness of the stack 110 can be about 1-20 microns, such as 8-10 microns. Any suitable number of transistors or memory cells can be formed in the stack 110, such as 32, 64, 96, 128, and the like. Accordingly, numbers of the first layers 122 and the second layers 124 may vary according to the number of the memory cells in the stack 110.

Referring to FIG. 2A, a mask layer or a sacrificial layer 250 can be formed and patterned over a topmost layer, such as the topmost second layer 124(1), of the stack 110 to protect the semiconductor device 100 during subsequent processing. The mask layer 250 can include one or more hard mask sublayers 251-253, such as silicon nitride and silicon oxide. In various embodiments, the mask layer 250 can be patterned according to any suitable techniques, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like.

Referring to FIGS. 2B, 2C and 10, at step S1020 of the process 1000, multiple trenches 230(1)-(4) extending into the substrate 101 can be formed according to the patterned mask layer 250 using any suitable process. In an example, an upper portion of the substrate 101, portions of the insulating layers 111 and 116, the layer 123, the first layers 122, and the second layers 124 that are exposed by the patterned mask layer 250, are removed to form the trenches 230(1)-(4). The trenches 230(1)-(4) are formed using an etching process, such as a dry etching. The dry etching can be a plasma etch referred to as a plasma punch.

The trenches 230(1)-(4) can have any suitable shapes and sizes. According to aspects of the disclosure, the trenches 230(1)-(4) are elongated along the X direction where a length L of the trenches 230(1)-(4) is significantly larger than a width W of the trenches 230(1)-(4). In an example, a ratio of the length L over the width W is larger than a threshold, such as 10. A depth H of the trenches 230(1)-(4) is larger than the width W, and a ratio of the depth H over the width W can be larger than, for example, 10, resulting in the elongated and deep trenches 230(1)-(4). The trenches 230(1)-(4) can have an elongated rectangular shape in the XY plane and are parallel to the X direction. In the example shown in FIGS. 2B-2C, the first sidewall 160a and the second sidewall 160b have a planar shape, and cross-sectional shapes of the first and second sidewalls 160a-b in the XY plane are parallel straight lines. Of course, the trenches 230(1)-(4) can have other elongated shapes in the X-Y plane. For example, the cross-sectional shapes of the first and second sidewalls 160a-b in the XY plane are not limited to straight lines and can include any suitable lines, such as curves with any suitable number of turns and curvatures or a combination of straight line(s) and curve(s). On the other hand, the length L that indicates a distance along the X direction between two ends of the cross-sectional shape of the first sidewall 160a in the XY plane is much larger than the width W that indicates a distance between the first and second sidewalls 160a-b along the Y direction. The cross-sectional shapes of the first and second sidewalls 160a-b in the XY plane can be parallel or not parallel to each other.

Further, in the Z-Y plane, the trenches 230(1)-(4) can also have a tapered profile where a top width is larger than a bottom width. The tapered profile can be obtained by tapering a mask profile of the patterned mask layer 250, adjusting parameters of the etching process, and the like. A tapered profile can help subsequent deposition steps and improve a sidewall coverage. In an example, the top width can range from 90 to 160 nm, such as 120 nm, and the bottom width can range from 50 to 110 nm, such as 95 nm.

In some examples, a subsequent plasma ashing and a wet clean can be applied to remove the remaining mask layer 250. In FIG. 2C, the mask layer 250 remains over the stack 110.

During subsequent manufacturing steps, the units 1-16 in the columns C1-C4 can be manufactured in the trenches 230(1)-(4), respectively. For purposes of clarity, subsequent description is made based on the trench 230(3) in a region 300 in FIGS. 2B-2C. The units 9-12 in C3 are manufactured in the trench 230(3). The description can be suitably adapted to the other trenches 230(1), (2), and (4) in the semiconductor device 100.

Figure 3A:
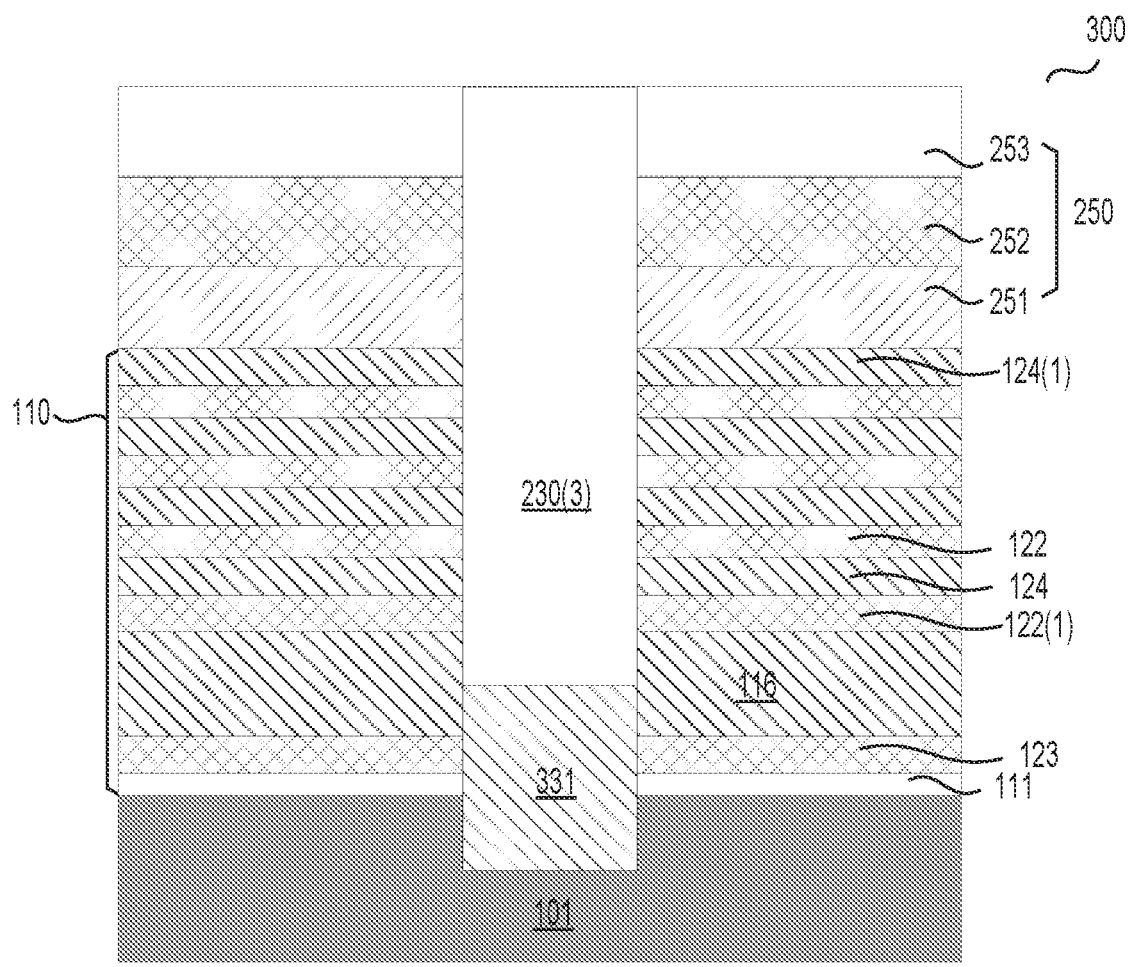
FIGS. 3A, 4A, 5A, 6A, 7A, and 8A are cross-sectional views of the portion of the semiconductor device 100 sectioned along BB' in respective FIGS. 3B, 4B, 5B, 6B, 7B, and 8B according to exemplary embodiments of the disclosure.
Figure 3B:
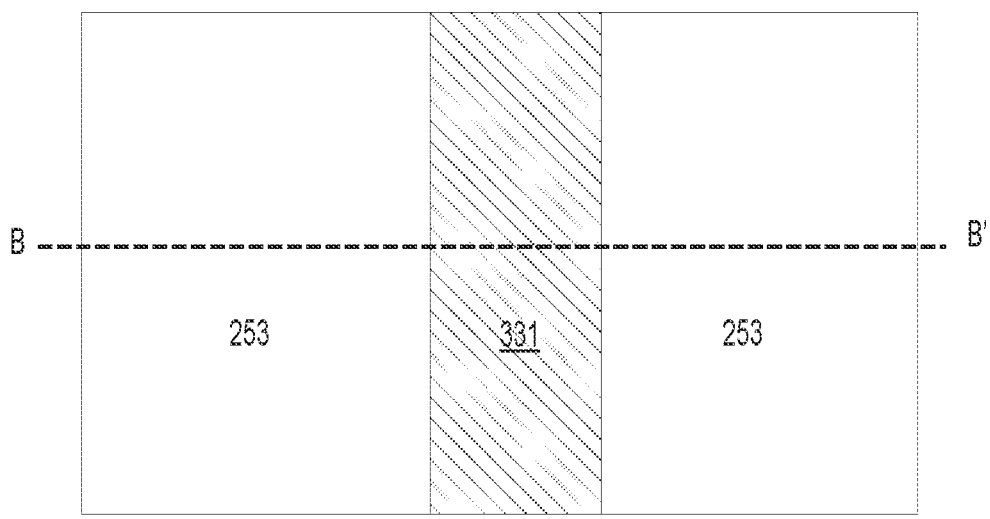
FIGS. 3B, 4B, 5B, 6B, 7B, and 8B are top views of a portion of the semiconductor device 100 at various steps of an exemplary process according to exemplary embodiments of the disclosure.

At step S1030 of the process 1000, contact layers are formed in the trenches 230(1)-(4). Referring to FIGS. 3A and 3B, the contact layer 331 is formed in the trench 230(3) of the region 300. The contact layer 331 can be formed using silicon deposited via a selective epitaxially growth technique. The contact layer 331 can include monocrystalline Si. In an example, the contact layer 331 has a thickness of 190 nm. An oxide layer, such as silicon oxide with a thickness of 2-5 nm, can subsequently be formed over the contact layer 331 by an oxidation process. The contact layer 331 can be divided into first contacts in the units 9-12 of C3 in subsequent manufacturing steps. The first contacts include the first contact 131 in the unit 10 shown in FIG. 1B.

Figure 4A:
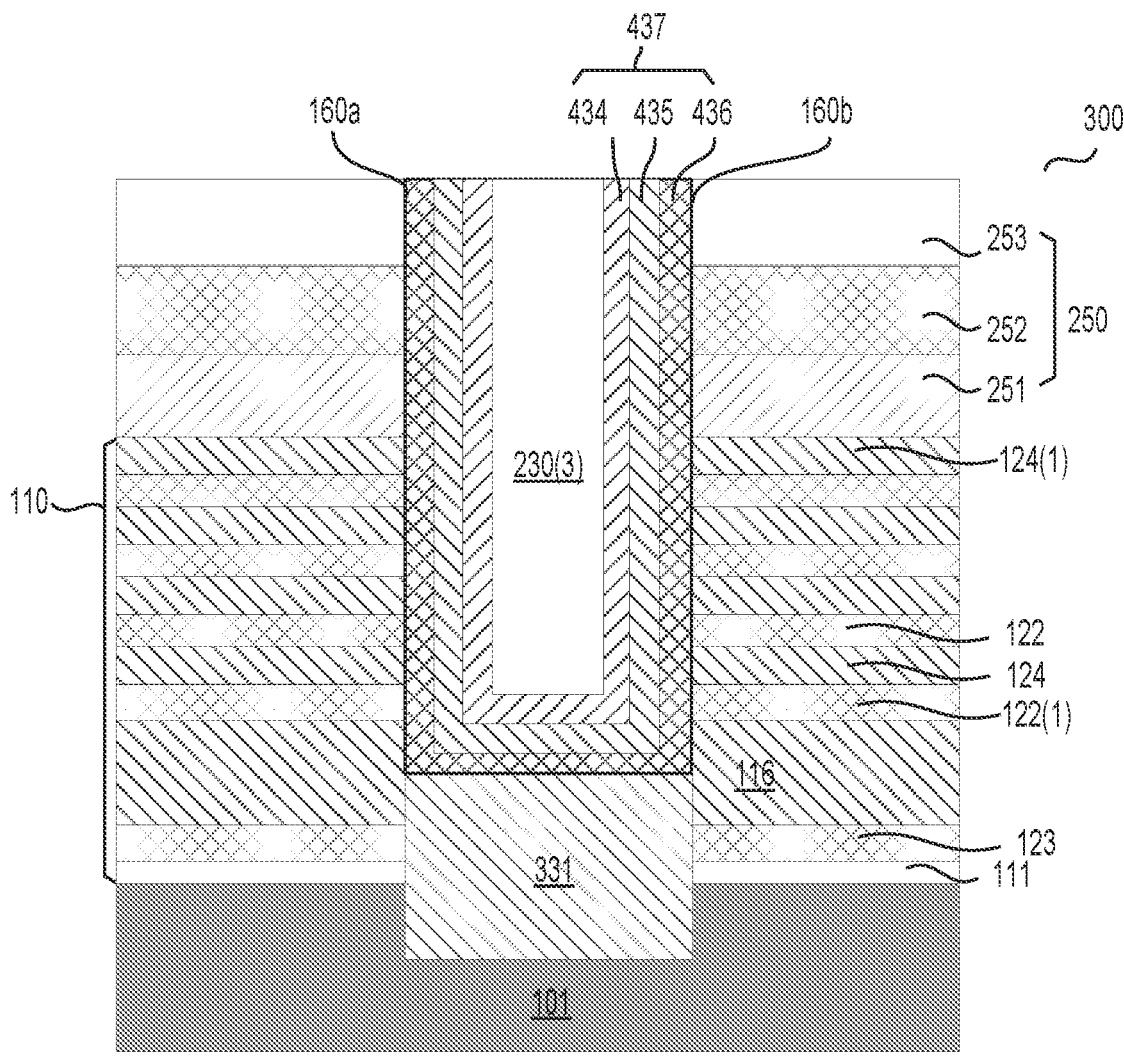
Figure 4B:
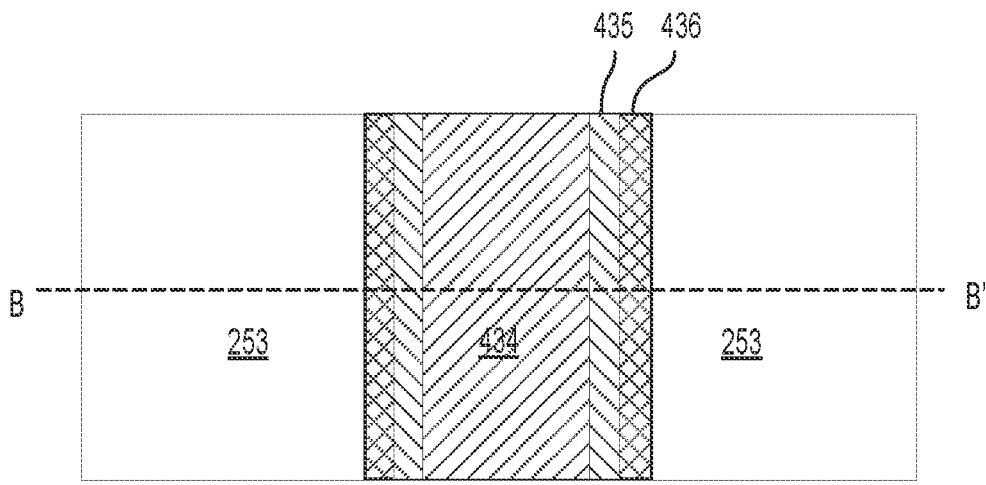

At step S1040 of the process 1000, gate dielectric layers are formed within the trenches 230(1)-(4). Referring to FIGS. 4A and 4B, the gate dielectric layer 437 is formed within the trench 230(3). The gate dielectric layer 437 can be conformably formed by sequentially depositing a blocking insulating layer 436, a charge storage layer 435, and a tunneling insulating layer 434 over the first and second sidewalls 160a-b of the trench 230(3) and above the contact layer 331, respectively. The gate dielectric layer 437 can be divided into the gate dielectric layers in the units 9-12 of C3, such as the gate dielectric layers 137a-b in the unit 10 shown in FIG. 1B, in subsequent manufacturing steps.

The blocking insulating layers 436, the charge storage layer 435, and the tunneling insulating layer 434 can be formed using any suitable process, such as an ALD process, a CVD process, a PVD process, or a combination thereof. The tunneling insulating layer 434 can be formed of SiO2, Si3N4, SiON, HfO2, Al2O3, and the like and have a thickness from 1 to 5 nm based on design requirements. The charge storage layer 435, for example, having a thickness from 3 to 10 nm, can be formed of silicon nitride, and may also include quantum dots or nanocrystals. The blocking insulating layer 436 with a thickness ranging between 1 and 10 nm can include SiO2, HfO2, ZrO2, Al2O3, tantalum oxide, a combination thereof, and the like. In an example, the blocking insulating layer 436 includes SiO2 formed by oxidizing a pre-formed silicon nitride layer via an in situ steam generation (ISSG) process, the charge storage layer 435 includes a multi-layer configuration formed by silicon nitride and silicon oxynitride, and the tunneling insulating layer 434 includes a multi-layer configuration formed by silicon oxide and silicon oxynitride. In an example, a thickness of the gate dielectric layer 437 can range from 5 to 25 nm according to design requirements.

Figure 5A:
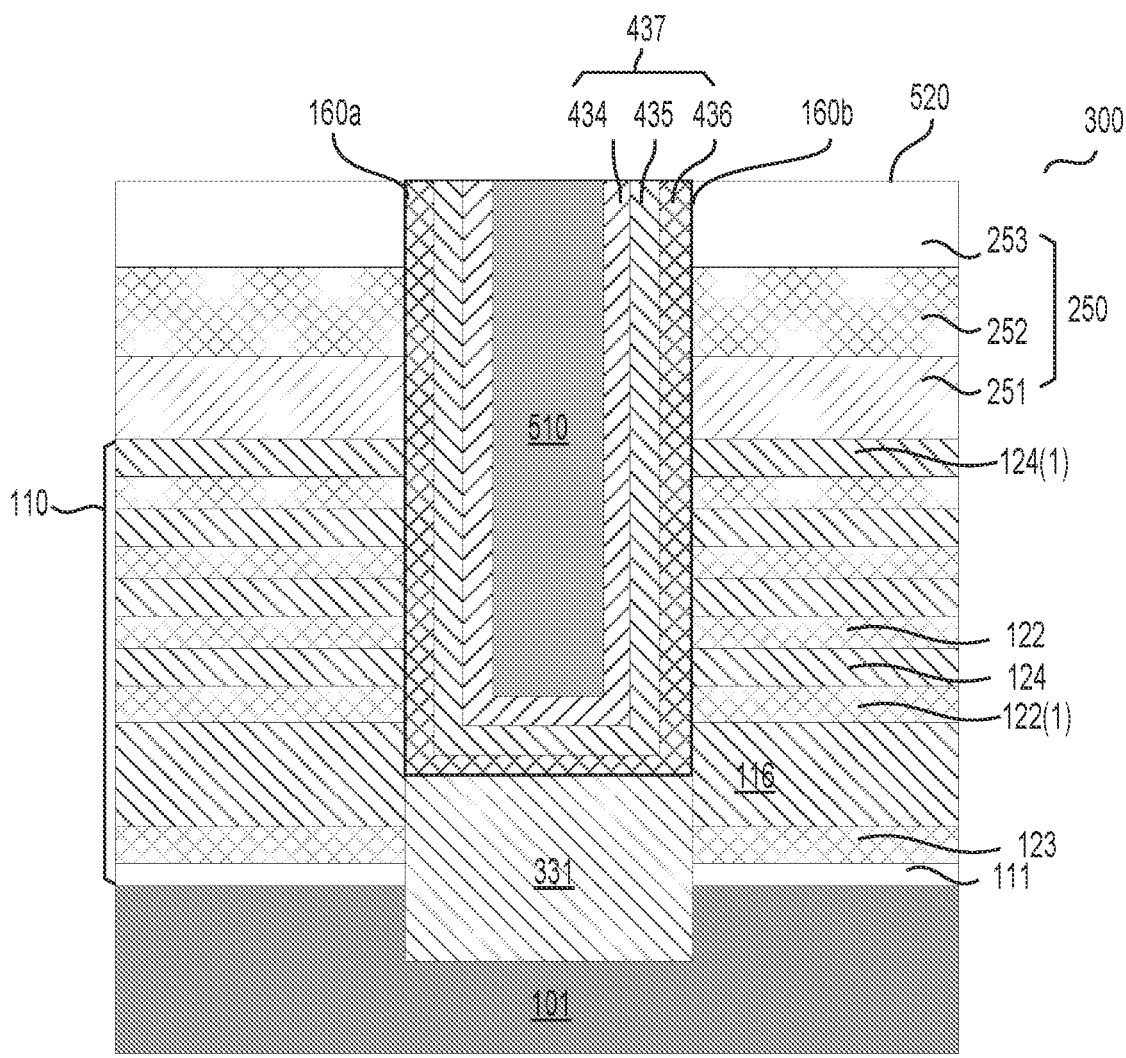
Figure 5B:
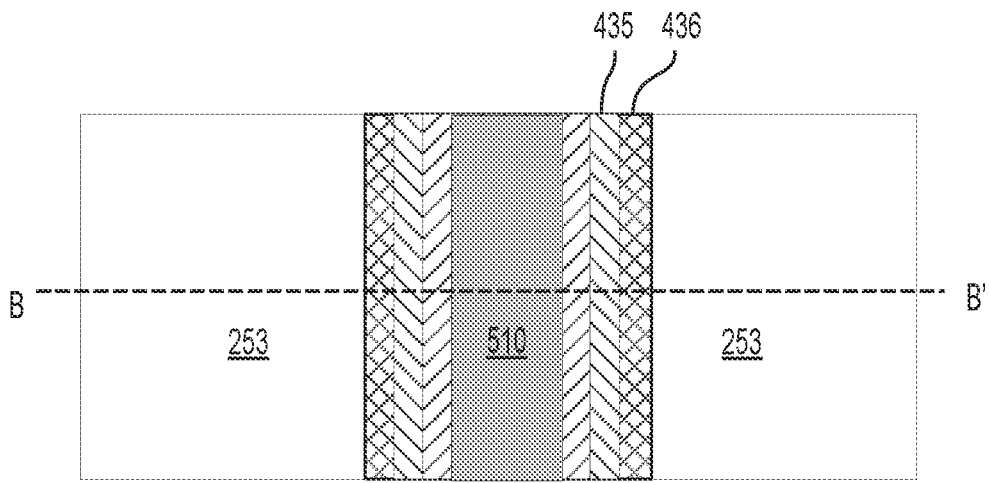

At step S1050 of the process 1000, channel layers can be formed in the trenches 230(1)-(4). Referring to FIGS. 5A and 5B, the trench 230(3) is filled with a sacrificial layer 510. In the example shown in FIG. 5A, the trench 230(3) is completely filled by the sacrificial layer 510. In some examples, the trench 230(3) is fully covered, however, is partially filled by the sacrificial layer 510.

In general, the sacrificial layer 510 can be conformably formed by depositing one or more sacrificial materials, such as polysilicon, tungsten, and/or the like, over the gate dielectric layer 437. The sacrificial layer 510 can also be formed over a top surface 520 of the mask layer 250. The sacrificial layer 510 can be formed using any suitable process, such as an ALD process, a CVD process, a PVD process, or a combination thereof.

Figure 6A:
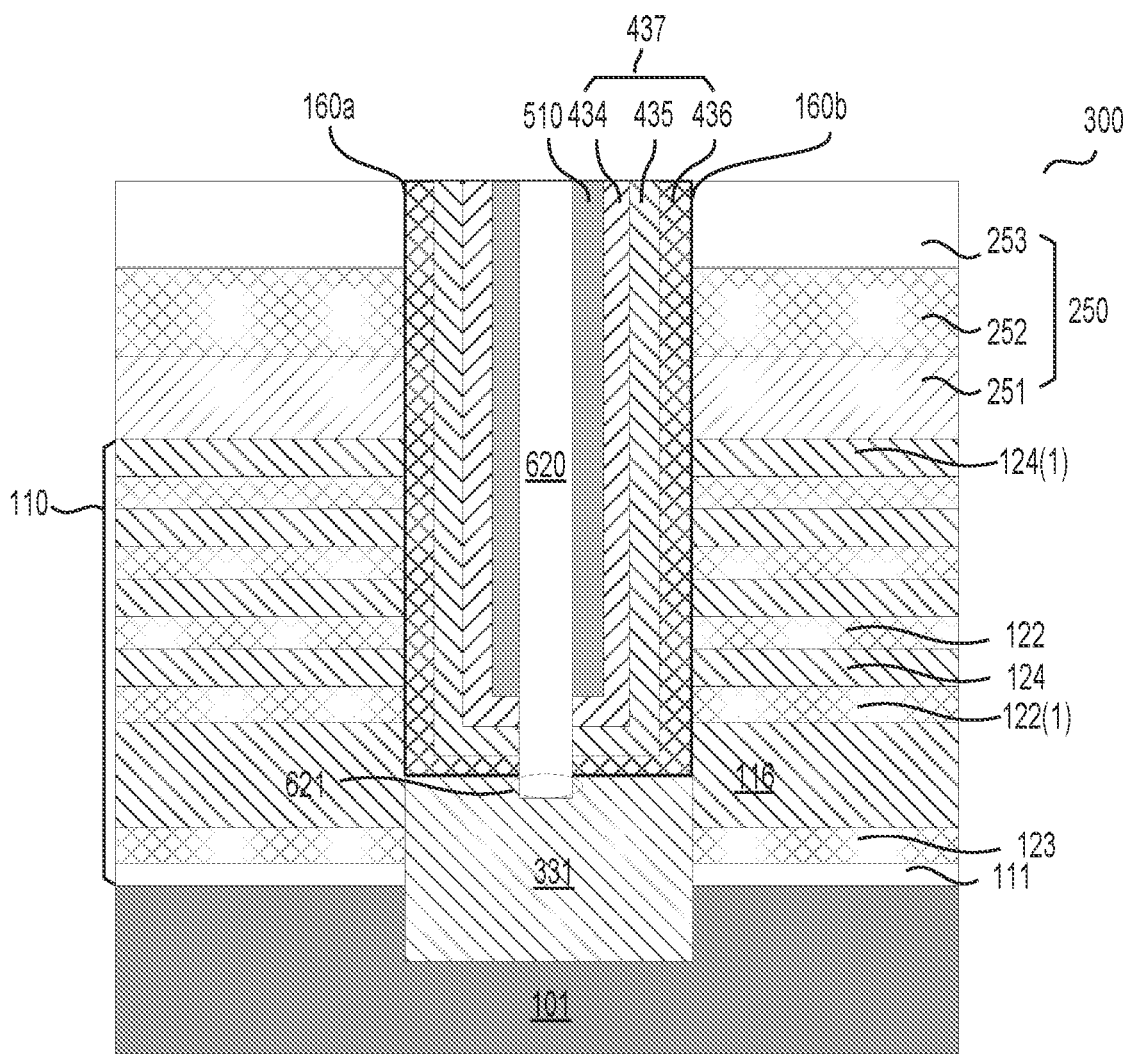
Figure 6B:
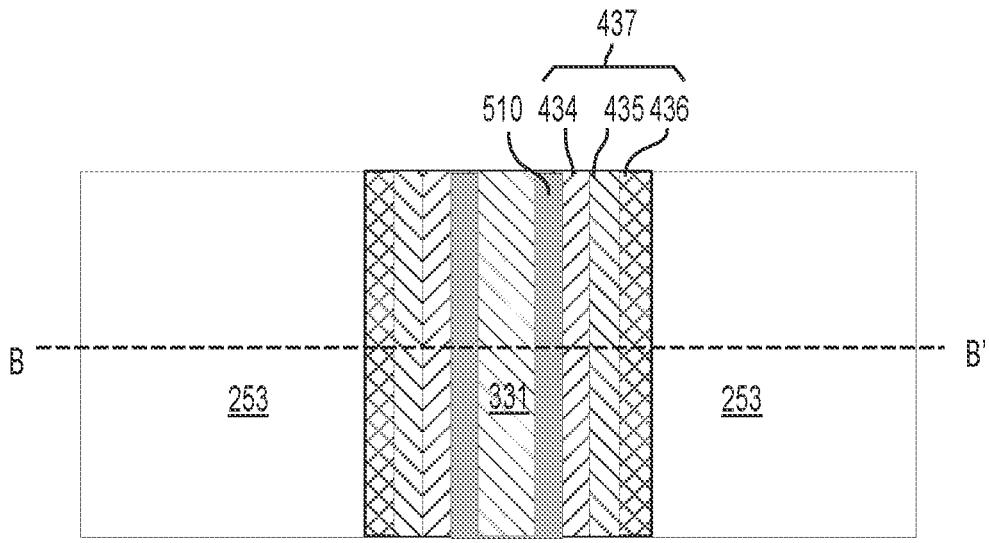

Referring to FIGS. 6A, 6B, and 10, also at step S1050, a trench 620 is formed in the trench 230(3) by removing portions of the gate dielectric layer 437 and the sacrificial layer 510 that are exposed by patterns of the mask layer 250. The trench 620 can also include a portion 621 that is formed in the contact layer 331. The trench 620 can be formed using an etching process, such as a dry etching.

Figure 7A:
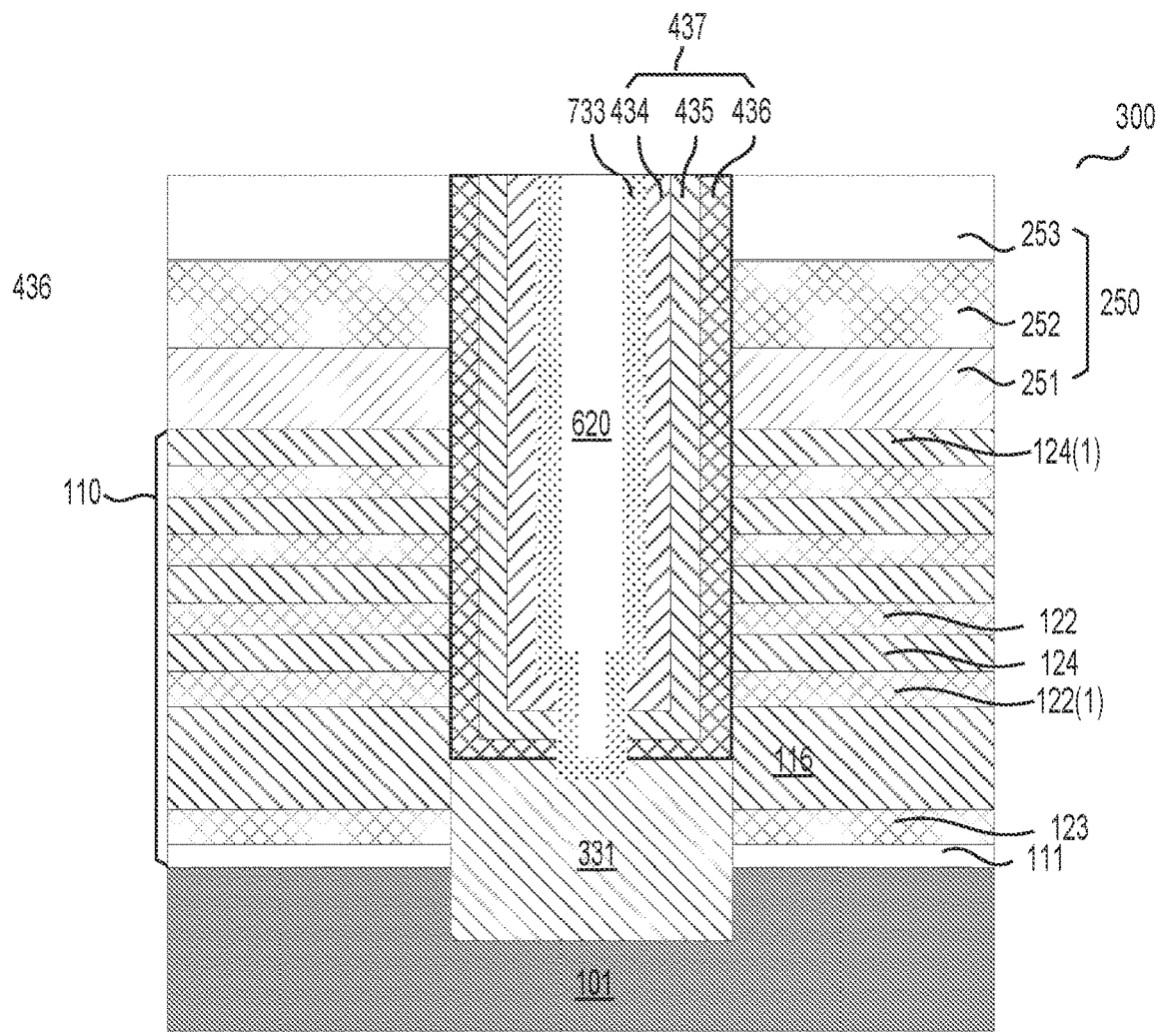
Figure 7B:
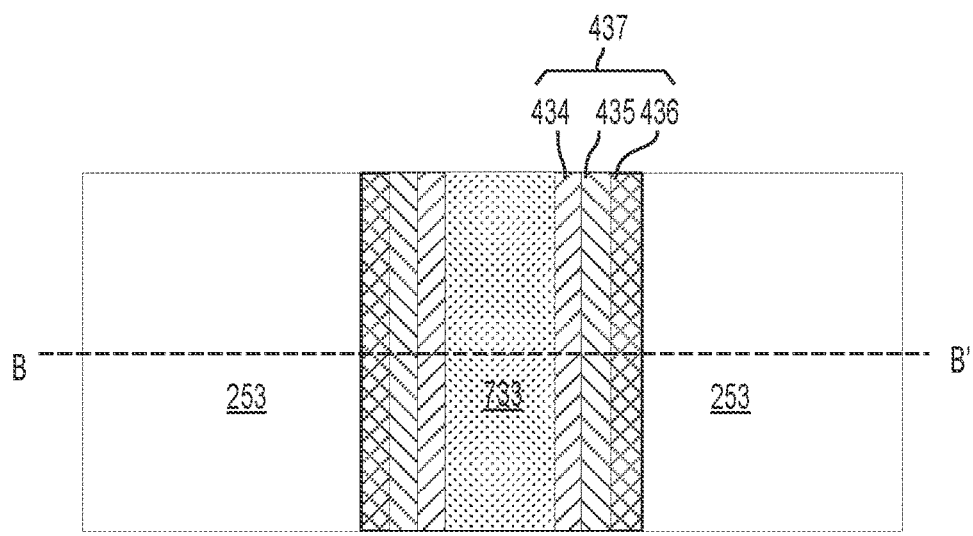

Referring to FIGS. 7A, 7B, and 10, also at step S1050, the sacrificial layer 510 is removed from the trench 230(3) by an etching process, such as a wet etching, a dry etching, or a combination thereof. In an example, the etching process is a wet etching. The etching process can be selective to remove the sacrificial layer 510 and minimally affect the contact layer 331, the gate dielectric layer 437, the first and second layers 122 and 124, and the like, in the stack 110.

Further, one or more semiconductor materials are deposited inside the trench 230(3) to form a channel layer 733 over the gate dielectric layer 437. The one or more semiconductor materials in the channel layer 733 can include intrinsic polysilicon, polysilicon doped with impurities, and the like. In an example, the one or more semiconductor material includes a polysilicon layer deposited using a low pressure CVD process. Other suitable deposition process can also be applied to form the channel layer 733, such as PVD, ALD, or any combination thereof. The channel layer 733 can be conformably formed on the sidewalls of the tunnel insulation layer 434 to have a thickness between 3 and 5 nm. In an example, the channel layer 733 is further annealed, for example, to improve quality of the polysilicon layer. The channel layer 733 can be divided into the channel layers in the units 9-12 of C3, such as the channel layers 133*a-b* in the unit 10 shown in FIG. 1B, in subsequent manufacturing steps.

At step S1060 of the process 1000, sacrificial layers can be formed in the trenches 230(1)-(4). Referring to FIGS. 8A-8B, the trench 620 is filled with the sacrificial layer 820. In the example shown in FIG. 8A, the trench 620 is completely filled by the sacrificial layer 820. In some examples, the trench 620 is fully covered and the sidewalls of the trench 620 are fully covered, however, is partially filled by the sacrificial layer 820. The sacrificial layer 820 can include dielectric materials, such as SiO2, one or more high-K materials, and the like. In an example, the sacrificial layer 820 is the insulating layer 138 shown in FIG. 1C. Alternatively, the sacrificial layer 820 can be removed subsequently and replaced with the insulating layer 138.

At step S1070 of the process 1000, the trenches 230(1)-(4) can be divided into multiple units by removing portions of the gate dielectric layers, the channel layers, and the contact layers down to the substrate 101. FIG. 9B is a top view of the portion of the semiconductor device and FIG. 9A is a cross-sectional view along CC' in FIG. 9B. Referring to FIGS. 9A-9B, the trench 230(3) is divided into the units 9-12 by removing portions of the gate dielectric layer 437, the channel layer 733, and the contact layer 331 to form narrow trenches 920 including first and second sidewalls 960*a-b*. The first and second sidewalls 960*a-b* are portions of the respective first and second sidewalls 160*a-b* of the trench 230(3). In various examples, an etching process, such as a wet etching, a dry etching, or a combination thereof, is used to remove the portions of the gate dielectric layer 437, the channel layer 733, the sacrificial layer 820, and the contact layer 331.

Remaining portions of the gate dielectric layer 437 and the channel layer 733 in the units 9-12 along the first and second sidewalls 160*a-b* correspond to the gate dielectric layers and the channel layers of the first strings of transistors and the second strings of transistors, respectively. For example, the remaining portions of the gate dielectric layer 437 and the channel layer 733 along the first and second sidewalls 160*a-b* in the unit 10 correspond to the gate dielectric layers 137*a-b* and the channel layers 133*a-b* of the string 10*a-b*, respectively. The remaining portions of the contact layer 331 in the units 9-12 correspond to the first contacts. For example, the remaining portion of the contact layer 331 in the unit 10 corresponds to the first contact 133. Further, the dielectric structures 181, such as SiO2, are conformably formed in the trenches 920 over the contact layer 331 and along the first and second sidewalls 960*a-b* of the trenches 920, and thus electrically isolate the units 9-12. In an example shown in FIG. 9A, the dielectric structures 181 partially fill the trenches 920. Alternatively, the dielectric structures 181 can completely fill the trenches 920. Accordingly, the first strings formed along the first sidewall 160*a* are isolated by the dielectric structures 181, and the second strings formed along the second sidewall 160*b* are isolated by the dielectric structures 181.

At step S1080 of the process 1000, the CSRs and the gate structures are subsequently formed. Referring to FIGS. 1A-1C, the second layers 122 and the layer 123 are removed and replaced with the respective gate structures 151*a*(1)-(5) and 151*b*(1)-(5). The dielectric structures 171 can be formed adjacent to the gate structures and/or the CSR 52. In addition, the second contacts 182*a-b* and the bit lines connecting the second contacts 182*a-b* can be formed. Then, the process 1000 proceeds to step S1099, and terminates.

Also additional steps can be provided before, during, and after the process 1000, and one or more of the steps described above can be replaced, eliminated, adapted, and/or performed in different order for additional embodiments of the process 1000. In an example, instead of being formed in step S1030, the first contact 131 can be formed at the step S1050 after removing the sacrificial layer 510. Various additional interconnect structures (e.g., metallization layers having conductive lines and/or vias) may be formed over the semiconductor device 100. Such interconnect structure electrically connect the semiconductor device 100 with other contact structures and/or active devices to form functional circuits. Additional device features such as passivation layers, input/output structures, and the like may also be formed.

The process 1000 can be combined with other process flows to manufacture other suitable semiconductor components (not shown), such as other types of transistors, bipolar junction transistors, resistors, capacitors, inductors, diodes, fuses, and the like, on the semiconductor device 100. In various embodiments, the process 1000 can also be combined with additional process flows to manufacture other suitable circuits, for example, a peripheral circuit for driving the memory cells, a sense amplifier for reading data stored in the memory cells, a decoding circuit, and/or the like. The steps of the process 1000 are merely exemplary and are not intended to be limiting.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
one or more units of strings of cells; and
dielectric structures extending in a vertical direction and a first direction perpendicular to the vertical direction and separating adjacent units of strings of cells,
wherein each unit of strings of cells comprises:
a first string of cells, each comprising first cells, and
a second string of cells, each comprising second cells,
wherein parts of the units of strings of cells are separated by a common source region extending in a second direction perpendicular to the first direction and the vertical direction, wherein the common source region comprises a doped region and a conductive layer on the doped region.

2. The semiconductor device according to claim 1, wherein the dielectric structures comprise a first dielectric structure and a second dielectric structure partially surrounding the first string of cells and the second string of cells.

3. The semiconductor device according to claim 2, wherein each unit of strings of cells further comprises:
a separating insulating layer between the first string of cells and the second string of cells.

4. The semiconductor device according to claim 3, wherein the first string of cells and the second string of cells are on two sides of the separating insulating layer, and the first dielectric structure and the second dielectric structure are on another two sides of the separating insulating layer.

5. The semiconductor device according to claim 1, wherein each unit of strings of cells further comprises:
a first channel structure extending in the vertical direction comprising a first channel layer and a first gate dielectric structure;
first gate structures;
a second channel structure extending in the vertical direction comprising a second channel layer and a second gate dielectric structure; and
second gate structures.

6. The semiconductor device according to claim 5, wherein the first channel structure and the second channel structure have a planar shape and are opposite to each other.

7. The semiconductor device according to claim 5, wherein each of the first cells comprises:
a portion of the first channel structure, and
one of the first gate structures, wherein each of the second cells comprises:
a portion of the second channel structure, and
one of the second gate structures.

8. The semiconductor device according to claim 7, wherein the one of the first gate structures is in contact with the portion of the first channel structure, and the one of the second gate structures is in contact with the portion of the second channel structure.

9. The semiconductor device according to claim 5, further comprising:
first insulating layers separating the first gate structures; and
second insulating layers separating the second gate structures.

10. The semiconductor device according to claim 9, wherein the first insulating layers are made of a different material than the dielectric structures.

11. The semiconductor device according to claim 9, wherein the first cells are partially surrounded by two of the first insulating layers in the vertical direction.

12. The semiconductor device according to claim 5, wherein the parts of the units of strings of cells are arranged in columns.

13. The semiconductor device according to claim 12, wherein the parts of the units of strings of cells in adjacent columns are separated by a separating dielectric structure extending in the second direction.

14. The semiconductor device according to claim 13, further comprising:
a first contact electrically connected to the first channel layer.

15. The semiconductor device according to claim 14, wherein an extended portion of the separating dielectric structure is between the first contact and the common source region.

16. The semiconductor device according to claim 14, wherein the one or more units of strings of cells are formed on a substrate.

17. The semiconductor device according to claim 16, wherein the first contact extends into the substrate and coupled to the substrate.

18. The semiconductor device according to claim 5, further comprising:
a second contact electrically connected to the first channel layer; and
a third contact electrically connected to the second channel layer.

19. The semiconductor device according to claim 18, wherein the second contact and the third contact are staggered arranged in a plan view.

20. A semiconductor device, comprising:
one or more units of strings of cells; and
dielectric structures extending in a vertical direction and a first direction perpendicular to the vertical direction and separating adjacent units of strings of cells,
wherein each unit of strings of cells comprises:
a first string of cells, each comprising first cells,
a second string of cells, each comprising second cells,
a first channel structure extending in the vertical direction comprising a first channel layer and a first gate dielectric structure;
first gate structures;
a second channel structure extending in the vertical direction comprising a second channel layer and a second gate dielectric structure;
second gate structures,
a second contact electrically connected to the first channel layer; and
a third contact electrically connected to the second channel layer,
wherein the second contact and the third contact are staggered arranged in a plan view.

* * * * *